US008462519B2

(12) United States Patent
Bayar et al.

(10) Patent No.: US 8,462,519 B2
(45) Date of Patent: Jun. 11, 2013

(54) METHOD OF SHIELDING A CIRCUIT BOARD, CIRCUIT BOARD, ELECTROMAGNETIC SHIELD AND METHOD OF MANUFACTURING SAME

(75) Inventors: Esen Bayar, Northwood (GB); Steven David Clements, Newton Farm (GB); Graham James Quintal, Ruislip Manor (GB)

(73) Assignee: ETL Systems Ltd., Hereford (GB)

( * ) Notice: Subject to any disclaimer, the term of this patent is extended or adjusted under 35 U.S.C. 154(b) by 225 days.

(21) Appl. No.: 12/781,307

(22) Filed: May 17, 2010

(65) Prior Publication Data

US 2011/0279995 A1    Nov. 17, 2011

(51) Int. Cl.
*H05K 9/00* (2006.01)

(52) U.S. Cl.
USPC .......................................... 361/816; 361/818

(58) Field of Classification Search
USPC .................. 361/799, 816, 818; 174/35 R, 51
See application file for complete search history.

(56) References Cited

U.S. PATENT DOCUMENTS

| | | | | |
|---|---|---|---|---|
| 4,717,990 | A * | 1/1988 | Tugcu | 361/816 |
| 5,392,461 | A * | 2/1995 | Yokoyama | 455/90.2 |
| 5,495,399 | A * | 2/1996 | Gore et al. | 361/814 |
| 5,838,551 | A * | 11/1998 | Chan | 361/818 |
| 5,844,784 | A * | 12/1998 | Moran et al. | 361/818 |
| 6,031,732 | A * | 2/2000 | Koike et al. | 361/816 |
| 6,043,992 | A * | 3/2000 | Scheibler | 361/818 |
| 6,049,469 | A * | 4/2000 | Hood et al. | 361/818 |
| 6,138,347 | A * | 10/2000 | Persson et al. | 29/836 |
| 6,166,918 | A * | 12/2000 | Olofsson et al. | 361/800 |
| 6,426,881 | B1 * | 7/2002 | Kurz | 361/800 |
| 6,650,546 | B2 * | 11/2003 | Nelson et al. | 361/738 |
| 7,183,498 | B2 * | 2/2007 | Ogura et al. | 174/387 |
| 7,663,895 | B2 * | 2/2010 | Huang | 361/818 |
| 7,872,878 | B2 * | 1/2011 | Horng | 361/818 |
| 2002/0118517 | A1 | 8/2002 | Giles | |
| 2007/0139904 | A1 | 6/2007 | English | |
| 2009/0273912 | A1 | 11/2009 | Myers | |
| 2010/0149780 | A1 | 6/2010 | Ren | |
| 2011/0211327 | A1 | 9/2011 | Myers | |

FOREIGN PATENT DOCUMENTS

| | | |
|---|---|---|
| CN | 201336797 | 10/2009 |
| DE | 199 45 427 | 11/2000 |
| WO | WO 2006/563639 | 5/2006 |
| WO | WO 2009/134559 | 11/2009 |

OTHER PUBLICATIONS

International Search Report and Written Opinion issued in PCT/GB2011/050933 on Sep. 26, 2011.
Machine English Translation of DE 199 45 427 published Nov. 2, 2000.
English Language Abstract of CN 201336797 published Oct. 28, 2009.

* cited by examiner

*Primary Examiner* — Hung S Bui
(74) *Attorney, Agent, or Firm* — DLA Piper LLP (US)

(57) ABSTRACT

There is disclosed a method of shielding a circuit board, a circuit board, an electromagnetic shield and a method of manufacturing an electromagnetic shield. In an aspect, the method comprises placing a first electromagnetic shield over a first area of the circuit board and placing a second electromagnetic shield over a second area of the circuit board. At least one of the electromagnetic shields has at least one projection therefrom that contacts and makes electrical connection with a surface of the other electromagnetic shield when the shields are placed on the circuit board.

19 Claims, 8 Drawing Sheets

METHOD OF SHIELDING A CIRCUIT BOARD, CIRCUIT BOARD, ELECTROMAGNETIC SHIELD AND METHOD OF MANUFACTURING SAME

The present invention relates to a method of shielding a circuit board, a circuit board, an electromagnetic shield and a method of manufacturing an electromagnetic shield.

In preferred embodiments, the present invention relates to the use of multiple electromagnetic shields, also known, as "cans" for shielding different areas of a circuit board.

It is a goal common to the design of many electronic devices to provide shielding to inhibit the emission of electromagnetic radiation generated by electronic components and circuitry and prevent the radiation from leaking into the atmosphere and/or interfering with other parts of the electronic device, as well as shielding electronic components and circuitry from radiation from their surroundings. These considerations are relevant to at least some degree to the vast majority of electronic devices, for example mobile phones, switching fabrics, etc. In many applications, regulatory authorities limit the permitted emissions. The trend is for higher and higher shielding requirements in the future.

The general approach to shielding of electromagnetic emissions is to surround the electronic components generating the electromagnetic, emissions in an electrically conductive compartment that is electrically connected to ground in order to contain the electromagnetic radiation. Various schemes are known to accomplish this type of shielding.

In a first scheme, the housing of the device is constructed of a conductive material, either metal or metalised plastic and is used to form all or a part of the conductive compartment. Typically, the housing is made of a front and a rear housing/cover which mate with each other and the printed circuit board to hold the printed circuit board within the two housings. Mating typically occurs along the perimeter of the two housings and the printed circuit board. To inhibit the emission of electromagnetic radiation, a semi-lossy conductive gasket, or alternatively a strip of conductive copper fingers, may be placed along the perimeter of the two housings to make an electrical contact between the conductive housings. This assembly is normally also connected to a ground plane of the circuit. This provides a radio frequency seal and creates a conductive compartment within the two housings of the cellular telephone. However, this scheme tends to be costly due to the expense of the metal or metalised plastic housings, as well as being inflexible. Furthermore, there is a risk that the conductive housings may come into physical contact with the electronic components on the printed circuit board causing short circuits.

A second scheme for shielding electromagnetic emissions is to place an electromagnetic shield or can made of conductive metal over the electronic components or circuitry requiring shielding. The shield can is typically soldered to ground pads on the printed circuit board by which it makes a direct electrical connection to an inner layer ground plane shielding the electronic components from the backside. Thus, the shielded electronic components are surrounded in an electrically conductive compartment comprised of the shield can and the ground plane. More than one shield may be provided to create more than one compartment where it is desired to shield different areas of the circuit board. This approach to shielding is a very low cost solution with respect to material costs. However this approach has drawbacks associated with inspection, troubleshooting, and repair of the telephone, including application, removal, and replacement of the shield. Furthermore, should the shield can need to be removed in order to repair an electronic component or circuitry, there is the possibility of damage to these and other nearby components during the repair process. While it is known to have shields that reversibiy attach to the circuit board, this scheme makes more complicated arrangements of more than one shield difficult to achieve as well as taking up a large amount of space on the board.

Existing schemes are increasingly unsatisfactory. What is needed is a shielding scheme suited to challenging applications where very low level leakage is of paramount importance, and adaptable to providing different shielding arrangements, whilst providing a solution which is low cost, and simple to manufacture, fit and assemble.

According to a first aspect of the present invention, there is provided a method of shielding a circuit board, the method comprising: placing a first electromagnetic shield over a first area of the circuit board; and, placing a second electromagnetic shield over a second area of the circuit board, wherein at least one of the electromagnetic shields has at least one projection therefrom that contacts and makes electrical connection with a surface of the other electromagnetic shield, when the shields are placed on the circuit board.

The shields are preferably formed of electromagnetic reflecting material, such as preferably metal. In preferred embodiments, the shields will include a planar portion that lie parallel to the circuit board and have side portions that depend from the planar portion towards the circuit board and attach to the circuit board via clips on the circuit board. References to upper and bottom and sides in relation to the shield are to be interpreted relative to the standard orientation of a circuit, i.e. with components facing upwards, rather than implying any particular absolute orientation of the circuit board. I.e. upper refers to the part furthest; away from the circuit board, bottom refers to the part closest to the circuit board, and side refers to the peripheral parts in the plane of the circuit board.

The projections provide electrical continuity between the shields used in the apparatus. Where advantageous these features are aligned to provide a wall, hence forming a further barrier to undesired electromagnetic energy transfer from one compartment to the other. These arrangements enhance the electromagnetic shielding characteristics of the apparatus and may reduce number of shielding devices needed in the assembly as well as providing improved electrical performance. It also allows insertion and build up of the electromagnetic shield in stages facilitating tuning and adjustments as the work progresses.

The preferred embodiment overcomes or largely alleviates electromagnetic leakage problems in circuits containing radio waves where respective parts of printed circuit boards, or other medium accommodating electrical circuitry, require shielding to improve electromagnetic isolation across different functional blocks or parts of the same functional line up. The components of the apparatus inherently provide electrical continuity as the protruded sections form walls or barriers narrowing or closing gaps. In places these features may be in contact with the walls of the other devices within the apparatus. The other devices of the apparatus may also be equipped with similar protruded features which may be interleaved, aligned or appropriately positioned to suppress, modify or contain electromagnetic energy as a result resolving electromagnetic interference, leakage problems in a practical and cost effective way.

Where these protruded parts are in contact with the adjoining components of the apparatus the electrical continuity is maintained and effectiveness of the shield is improved.

The apparatus offers a practical solution to challenging applications where very low level leakage is of paramount importance. It also provides a solution which is easy to manufacture, fit and assembly. Many established manufacturing techniques, including, etching, forming, pressing and other electrical, chemical, thermal or mechanical manufacturing methods can be used.

In an embodiment, the first electromagnetic shield is at least partially enclosed by the second electromagnetic shield. This allows an extra level of protection to be provided. For example, the circuit can comprise multiple areas each shielded by its own dedicated shield. These shields can be optionally in contact via the projections to provide continued conductance across the shields. An "umbrella" shield can be placed over all of the individual smaller shields, making contact with the individual smaller shields via projections on the individual smaller shields, to act as an additional layer of defence to contain any electromagnetic energy leaked by the individual smaller shields.

Alternatively, the first shield may form a compartment over a first area of the board, and the second shield may be placed over the first shield and a second area of the board not having a dedicated individual shield. The second shield makes electrical contact with the smaller shield via projections on the smaller shield. This in effect forms a separate shield around the second area. This concept can be extended to multiple areas on the circuit board. For example, where it is desired, to isolate a plurality of areas of the circuit board, individual shields having projections may be place over alternate areas of the board. An "umbrella" shield can then be placed over the top of all of the areas, making contact with the individual shields via the projections. In this way, a compartment is provided about all of the areas of the circuit board. So, for example, where there are ten adjacent areas requiring shielding on the board, five individual shields can be placed over alternate areas and one shield over the top. Thus, six shields are required instead of ten individual shields, which has the advantage of taking up less room on the board and being less expensive in parts and assembly. In a preferred embodiment, the areas not provided with individual shields may be areas to which regular access is required by a technician. By using the arrangement described above, access is simplified.

In an embodiment, the first shield has at least one of said projections on its top surface so as to contact and make electrical connection with a bottom surface of the second electromagnetic shield.

In an embodiment, the second shield has at least one of said projections on its bottom surface so as to contact, and make electrical connection with a top surface of the first electromagnetic shield.

In an embodiment, the first and second electromagnetic shields are positioned side by side on the circuit board and the first shield has at least one of said projections on a side surface so as to contact and make electrical connection with a side portion of the second electromagnetic shield. This allows adjacent areas of the board to be isolated by their own dedicated shield and for electrical connection to be made between the adjacent shields to provide improved grounding.

Preferably, at least one of the projections is resiliently biased from the body portion of the shield. This allows the connection between the projection and the second shield to be resiliently biased, improving the quality and reliability of the electrical connection between the two shields.

In a preferred embodiment, at least one projection is provided by a biased finger projecting from the body of the shield.

The springiness of the projection can be tuned to create the desired contact between the two shields. For example, it is generally desired to have a relatively soft contact between the two shields so that the shields are not deformed to a problematic degree by the force of the contact. The dimensions can be adjusted to provide the necessary contact pressure. This is a function of the springiness of the material, the form of the tab, the contact point on the finger, the deflection distance of the finger, the aspect ratio of the projection. Preferably for example, the projection will be at a shallow angle compared to the body of the shield, for example less than 30 degrees, more preferably less than 15 degrees, more preferably less than 10 degrees.

In an embodiment, the finger is formed by a cutout portion of the shield. Alternatively the finger may be formed by soldering or otherwise adhered to the shield. The finger may be curved or planar.

In an embodiment, an electromagnetic radiation absorbent material layer and/or an electromagnetic reflective material layer is disposed on the body of the shield on the opposite side to the projection. This may be used to cover the gap between the fingers and the body of the shield to eliminate or reduce any potential radiation leakage. The layer may be placed over all or selected portions of the body.

In an embodiment, at least one projection is formed by a stamped shaping on the surface of the body of the shield.

In an embodiment, at least one projection on a shield is formed by shaping on the surface of the body of the shield, and the other shield has corresponding shaping extending either towards or away from the other shaping.

Preferably, the method comprises providing a plurality of projections to create a plurality of contact points between the first and second shields.

In an embodiment, adjacent contact points are separated by a distance 'd', where d is less than 25% of the wavelength of the radiation being shielded. This helps reduce propagation modes in the shields by providing adequate electrical connection between the shields. Where the apparatus is devised to shield over a broad spectrum, the distance 'd' is preferably less than 25% of the wavelength of the highest frequency within the spectrum. However, practical considerations may influence the choice of 'd'. For example, for millimetric waves, the wavelengths are too short to make practical using the preferred spacing of less than 25% of the wavelength. In this case, integer multiples of the 25% wavelength may be used instead.

In a preferred embodiment, at least one shield is removably attached to the circuit. This allows access to the components within the compartments created by the shields for repair, configuration, testing etc. Following completion of configurations and tests all removable sections may be locked to avoid tempering, displacement during transport or use.

Preferably, the method comprises placing a first shield about a first area of the circuit to define a first shielded compartment, and placing a second shield about a second area of the circuit, including said first area, to define a second shielded compartment between the first and second shields.

This principle can be extended to many areas. For example, for a series of adjacent areas, alternate areas can be provided with their own individual shields. A large shield can be put over all of the areas including the individual shields. This forms cavities around the areas without their own individual shields. This reduces the component count and therefore lower cost/assembly. This also reduces amount of connectors needed, which increases the real estate of the board available for electronic components, as well as reducing cost. This also allows large areas of the board to be accessed by removing the large shield.

In a preferred embodiment, the first shield is made from a first material and the second shield is made from a second material different from the first material, the first material being stronger than the second material and the second material being more flexible than the first material.

By choosing appropriate materials, the gap between the shields may be reduced. This is desirable to prevent radiation leakage. When biased, the gap between shields is preferably less than 1 mm, more preferably less than 0.5 mm, and even more preferably less than 0.2 mm. Also, the shields may be configured to achieve a desired contact pressure between the shields to affect a good electrical connection between.

Preferably, the sheet member is less than 0.5 mm thick, and more preferably less than 0.25 mm. Preferably, the gaps between fingers are less than 0.1 mm.

In another embodiment, the second electromagnetic shield has a plurality of projections for contacting and making electrical connection with either the first electromagnetic shield or with another electromagnetic shield.

By extending this principle, complex shielding arrangements can be set up, whilst maintaining good electrical conductivity between the shields.

In an embodiment, at least one shield has plural parallel lines each having plural projections. This forms an enhanced barrier, minimising coupling across one line of projection to another or across the projections in a line. The projections of at least one line may be offset, or staggered, from the projections of an adjacent line. Multiple parallel lines of projections can be built with an offset to form an enhanced barrier minimising coupling across one line of projection to another or across the projections in a line According to a second aspect of the present invention, there is provided an electromagnetic shield for shielding a circuit board, the shield comprising a conductive sheet member having a central portion and side portions for clipping to a said circuit board, the member having a plurality of resiliently biased projections therefrom for contacting and making electrical connection with another electromagnetic shield.

In an embodiment, the shield has at least one of said projections on its top surface so as to contact and make electrical connection with a bottom surface of another electromagnetic shield.

In an embodiment, the shield has at least one of said projections on its bottom surface so as to contact and make electrical connection with a top surface of another electromagnetic shield.

In an embodiment, the shield has at least one of said projections on a side surface so as to contact and make electrical connection with a side portion of another electromagnetic shield.

Preferably, at least one of the projections is resiliently biased from the body portion of the shield.

Preferably, at least one projection is provided by a biased finger projecting from the body of the shield.

Preferably, the finger is formed by a cutout portion of the shield.

In an embodiment, an electromagnetic radiation absorbent material layer and/or an electromagnetic reflective material layer is disposed on the body of the shield on the opposite side to the projection.

In an embodiment, at least one projection is formed by a stamped shaping on the surface of the body of the shield.

Preferably, the shield has a plurality of projections to create a plurality of contact points between the first and second shields. Preferably adjacent contact points are separated by a distance 'd', where d is less than 25% of the wavelength of the radiation being shielded. Distance 'd' is preferably determined according to the frequency of operation. In case of a L-band device with frequencies of up to 2500 MHz, 25% of the wavelength in air is about 30 mm, and the preferred spacing is 20 mm, even more preferably 15 mm, and even more preferably 10 mm, taking it below 12.5% of the wavelength.

According to a third aspect of the present invention, there is provided a circuit comprising: a circuit, board; a first electromagnetic shield placed over a first area of the circuit board; and, a second electromagnetic shield placed over a second area of the circuit board, wherein at least one of the electromagnetic shields has at least one projection therefrom that contacts and makes electrical connection with a surface of the other electromagnetic shield when the shields are placed on the circuit board.

In an embodiment, a first shield is placed about a first area of the circuit to define a first shielded compartment, and a second shield is placed about a second area of the circuit, including said first area, to define a second shielded compartment between the first and second shields.

In an embodiment, the first shield is made from a first material and the second shield is made from a second material different, from the first material, the first material being stronger than the second material and the second material being more flexible than the first material.

According to a fourth aspect of the present invention, there is provided a method of manufacturing an electromagnetic shield, comprising: bending a conductive sheet member to form a plurality of projections therein for contacting and making electrical connection with another, adjacently positioned electromagnetic shield.

Preferably, the method comprises: cutting a plurality of fingers in a sheet metal member; bending said fingers to project away from said sheet metal member, said fingers providing said projections.

Preferably said cutting is performed by one or more of: i) laser etching; ii) chemical etching; and iii) stamping. Preferably the bending is performed by pressing the sheet material.

Embodiments of the present invention will now be described by way of example with reference to the accompanying drawings, in which.

Figure 1:
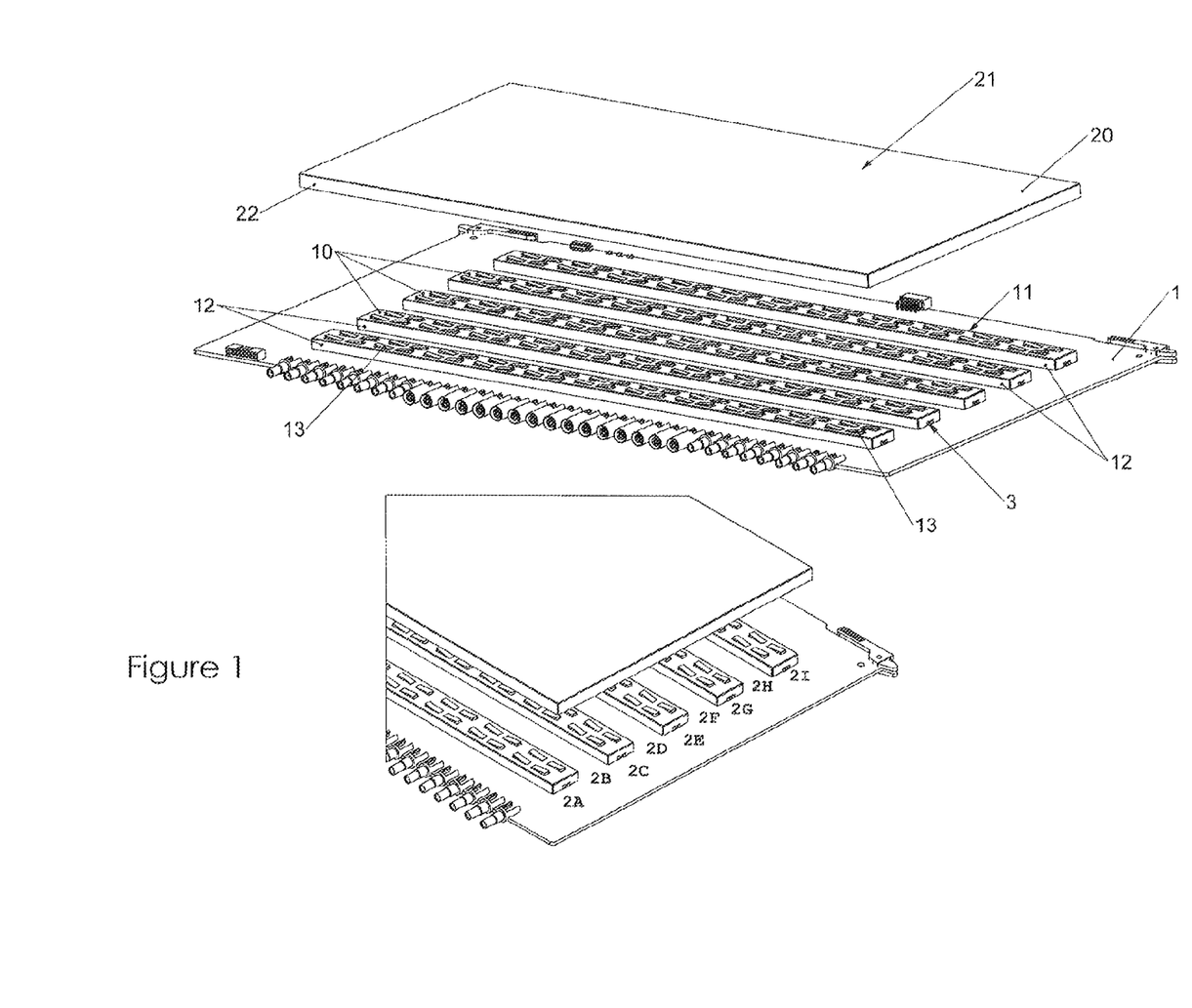
FIG. 1 shows an example of a circuit according to an embodiment of the present invention.

FIG. 1 shows a circuit board 1 comprising a plurality of components grouped in two areas 2A to 2I of the circuit board. Areas 2A, 2C, 2E, 2G and 2I are each provided with an electromagnetic shield 10, which forms a compartment around that area of the board. Each shield 10 is preferably made from sheet metal. Each shield 10 generally comprises a planar top portion 11, which is disposed parallel to the circuit board 1, and side portions 12, which depend from the periphery of the top portion 11 towards the circuit board 1. The circuit board 1 has a plurality of connector clips 3 attached thereto, for clipping to the side portions 12 of the shield 10 so as to reversibly secure the shield 10 in position on the circuit board 1. The connector clips 3 are preferably in electrical continuity, i.e. contact, with a ground plane (not shown) within the circuit board 1.

Thus, compartments are formed around the circuitry in each of areas 2A, 2C, 2E 2G and 2I by the metallic shield 10 and the ground plane, which contain the electromagnetic energy generated by the circuitry in that area due to the reflective nature of the metal.

Each of the shields 10 also comprises a plurality of projections 13 protruding upwardly from their top surfaces 21.

The circuit board 1 also has provision for placing a second electromagnetic shield 21 over areas 2k to 2I of the circuit board 1 (shown in exploded view in FIG. 1 for clarity). The second shield 20 is formed from sheet metal and has a top portion 21, which is generally parallel to the circuit board 1, and side portions 22, which depend from the top portion 21 towards the circuit board 1. Like for the first shield 10, connector clips 3 are provided, on the circuit, board 1 for reversibly connecting to the second shield 20.

When placed on the circuit board 1, electrical contact is made between the projections 13 on the first shield 10, and the underside of the second shield 20. Thus, further compartments are in effect formed, the boundaries of which are defined by the surrounding portions of the top shield 20, the bottom shield 10, and the ground, plane. These compartments effectively form compartments around each of the areas 2B, 2D, 2F and 2H of the circuit board. The side walls 12 of the first shield 10 in effect have a dual function, namely each provides a side wall for two adjacent compartments.

To assembly the circuit, the board 1 is manufactured with the components grouped together in predetermined areas according to which areas are to be shielded from other areas. One or more first shields 10 are attached to the board 1, to shield one or more first areas of the board (i.e. areas 2A, 2C, 2E, 2G and 2H in the example of FIG. 1). One or more second, shields 20 are then attached to the board 1, such that electrical connection is made between the first shields 10 and the second shields via the projections 13. The second shield 20 form further shielded areas of the board 1 (i.e. areas 2B, 2D, 2F and 2H in the example of FIG. 1).

Next, various detailed embodiments of the electromagnetic shields 10, 20 will be described.

Figures 2A, 2D:
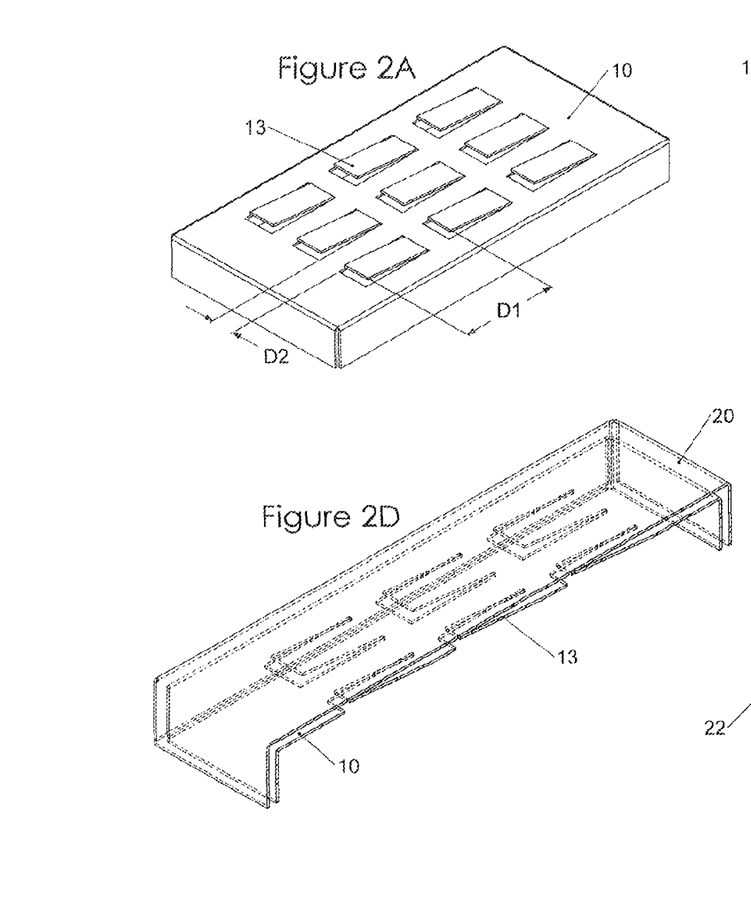
FIG. 2A shows a perspective view of an electromagnetic shield in accordance with an embodiment of the present invention.
FIG. 2D shows a perspective view of the shield of FIG. 2A in combination with a second shield.

Referring to FIG. 2A, a lower shield 10 is shown wherein the projections 13 are provided by a plurality of resiliently biased, upwardly projecting fingers 13. As can be seen from FIG. 2B, the fingers are planar, being attached to the top of the shield at one end, and having a contact point 14 at the opposite, uppermost end. In their unbiased position, the contact points 14 of the fingers 13 are raised by distance H1 from the top surface 11 of the shield 10. As can be seen from FIG. 2C, the fingers 13 are formed by cutting out a portion of the top surface 11 of the shield 10. The finger 13 has a width W and a length L. The gap between the finger 13 and the top surface 11 of the shield 10 formed by cutting out, has a gap width G. Referring again to FIG. 2A, it can be seen that the longitudinal distance between contact points 14 in a first direction is D1, and the lateral distance between contact points is D2.

FIG. 2D shows in cross-section a second, shield 20 placed in position over the first shield 10. The positioning of the second shield 20 causes the resiliently biased fingers 13 to deflect downwards due to the contact pressure between the contact points 14 and the underside of the second shield 20. The distance between the first shield and the second shield is given by H2.

Thus, a plurality of contact points is formed between, the upper 20 and lower 10 shields, providing electrical conductive between the shields. It is desirable to have good contact and conduction between the two shields 10, 20 to suppress undesired propagation modes, which will otherwise propagate to disturb the desired characteristics. In the present example, the contact point 14 of each resilient finger 13 is an edge, which gives a good sharp electrical contact between the two shields.

It should be noted that the resilient finger 13 is depressed when the second shield 20 is positioned over the first shield 10. This acts to close the gap in the first shield 10 formed by the cut-out finger 13 (from H1 to H2). Nonetheless, a small gap is still formed around the periphery of the finger 13 in use due to the cut out gap G and the raised height H2 of the end of the finger 13. This may potentially lead to some small leakage of electromagnetic energy from within the compartment contained by the first shield 10. However, it is anticipated that any such leakage can be made very small by producing the gaps G and H2 to be as small as possible and in any case much smaller than the upper wavelength of the radiation sought to be contained by the first shield 10.

Figure 2B:
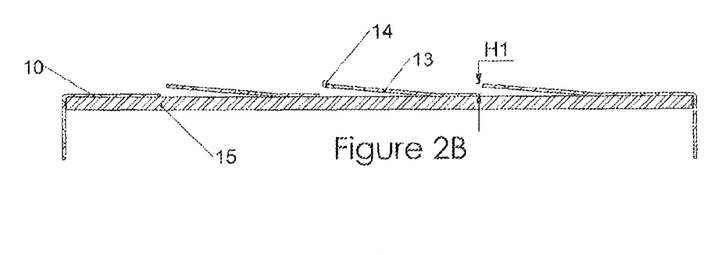
FIG. 2B shows a cross-sectional view of the shield of FIG. 2A taken along the long axis of the shield.
Figure 2C:
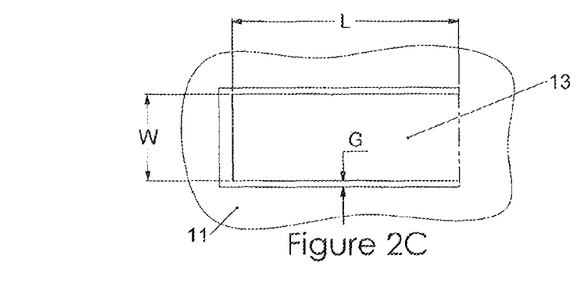
FIG. 2C shows a partial view of the shield of FIG. 2A viewed from, above.
Figure 2E:
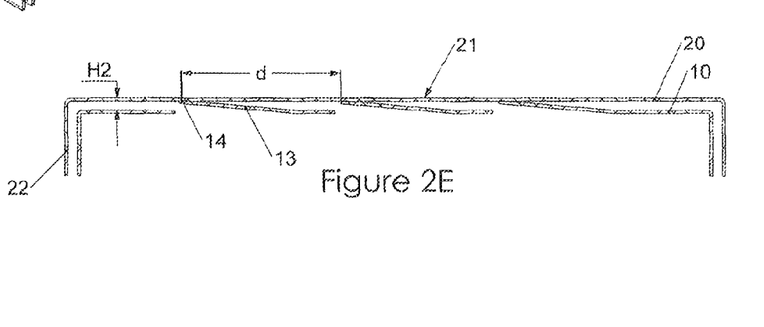
FIG. 2E shows a cross-sectional view of the arrangement of FIG. 2D.

Optionally, a layer of electromagnetic radiation absorbing material or electromagnetic reflecting material 15 can be attached to the surface of any shield having fingers or other projections, on the opposite side to the projections in order to seal any gaps around the periphery of the projections and eliminate or reduce any leakage of radiation. For example, as shown by FIG. 2B a layer 15 is attached to the underside of the first shield 10 to prevent radiation leakage from the gaps around the fingers 13. Examples of suitable electromagnetic reflecting material include copper tape, or other metallic tape, as known in the art per se. Examples of suitable radio wave absorbent materials include ferrite and carbon loaded sheets manufactured to facilitate easy cutting and forming, and to provide lining which enhances shielding properties.

The various characteristics of the contact between the first and second shields 10, 20 can be tuned by appropriate arrangement of the fingers 13. For example, the contact pressure between the fingers 13 and the second shield can be tuned by altering the resiliency of the fingers 13, or the shape of the contact points 13, i.e. by changing the width of the fingers W or the length of the fingers L, or locally thinning the material thickness of the fingers, or employing combinations of such measures. Additionally, the number of contact points can be changed by varying the distance between the fingers 13, i.e. by appropriate section of D1 and D2.

In order to provide good contact between the first and second shields 10, 20, to reduce undesired propagation modes, it is desirable that the separation between contact points 14 of adjacent fingers 13, i.e. represented by D1 and D2, is preferably less than 25% of the wavelength of the maximum frequency of electromagnetic radiation, sought to be contained by the shields. In case of millimetric wave propagations, where the wavelengths are too short to make practical separating the contact points 14 by less than 25% of the wavelength, integer multiples of 25% wavelength are preferably used. In this embodiment, the contact points 14 are equally spaced. Alternative spacing arrangement can be employed where beneficial, especially where broad spectrum or multiple parts of the spectrum are used and require shielding.

Another way of tuning the contact between the first and second shields 10, 20 is to form the shields from different types of metal. For example, Beryllium Copper can be used for the lower shield 10, because the springiness of the material is well suited to forming the resilient fingers 13; and stainless steel can be used for the second shield 20, because the stiffness and strength of this material is well suited to withstanding the forces applied to it by the contact fingers 13 without deforming. As will be appreciated, it is desirable in most instances to minimise the distance D2 between the first and second shields 10, 20, in order to save space.

Figure 3A:
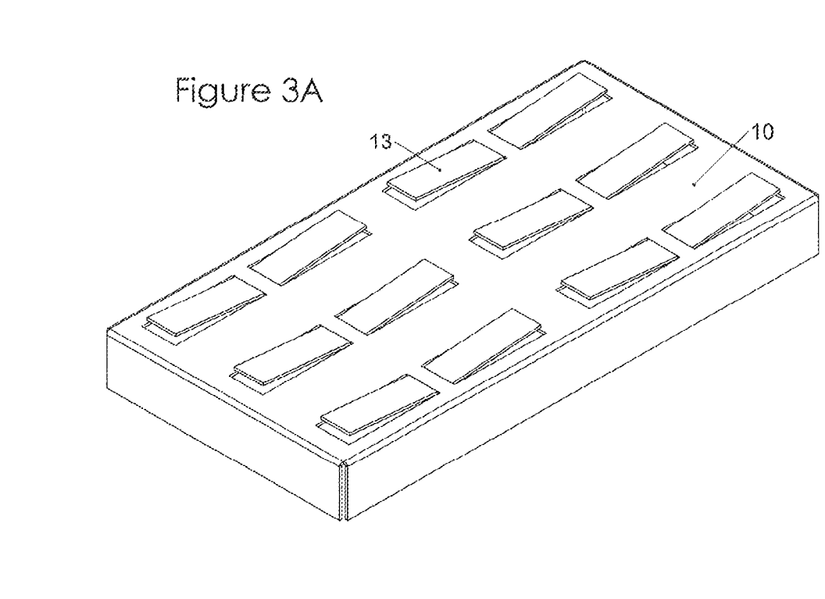
FIG. 3A shows another example of an electromagnetic shield according to an embodiment of the present invention.
Figure 3B:
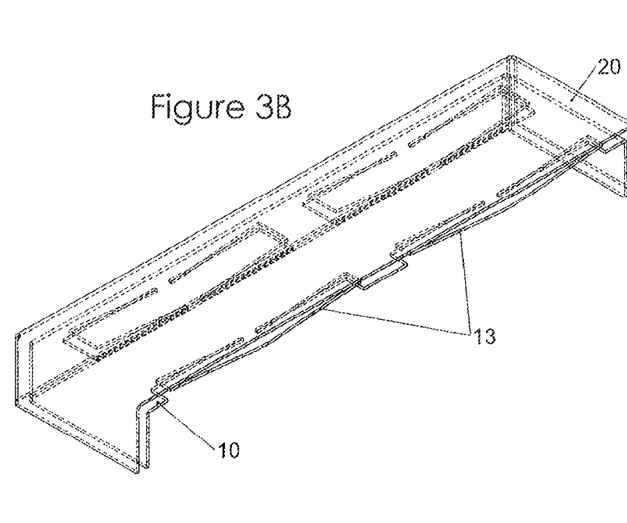
FIG. 3B shows a perspective view of the shield of FIG. 3A in combination with a second shield.
Figure 3C:
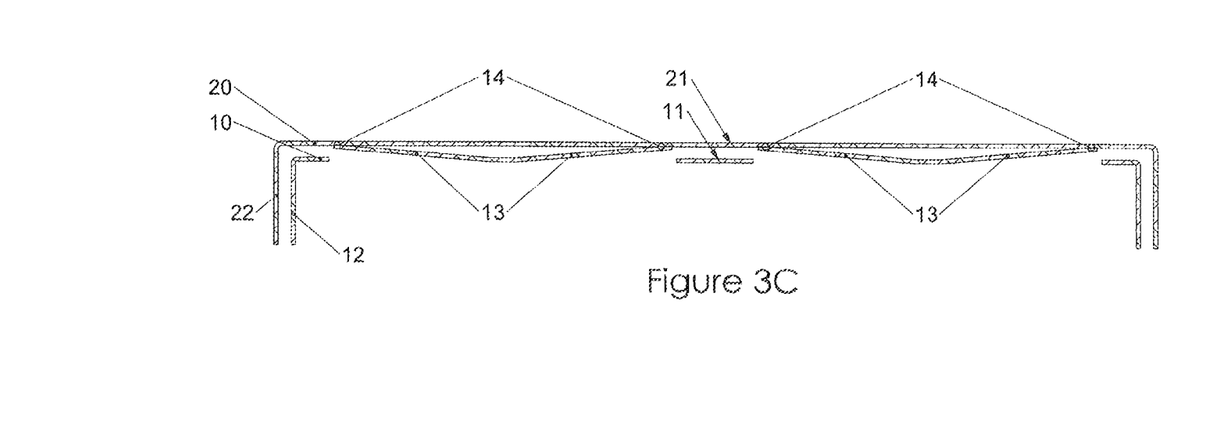
FIG. 3C shows a cross-sectional view of the arrangement of FIG. 3B.

FIGS. 3A to 3C show an electromagnetic shield 10 with a different arrangement of contact fingers 13. In this arrangement, the fingers 13 are planar and pairs of fingers 13 form a V-shape.

Figures 4A, 4B, 4C:
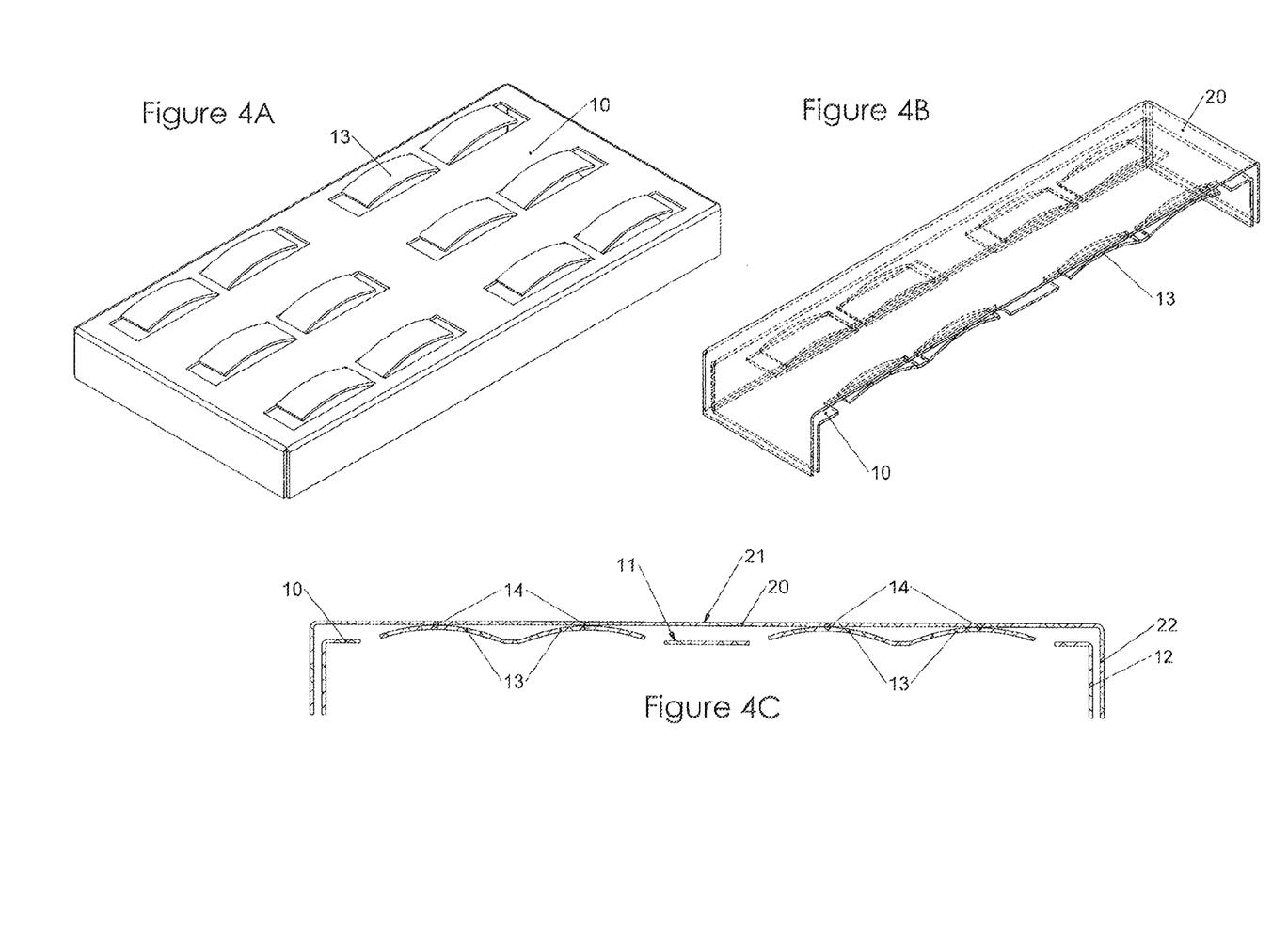
FIG. 4A snows a perspective view of an electromagnetic shield according to an embodiment of the present invention.
FIG. 4B shows the shield of FIG. 4A in combination with a second shield.
FIG. 4C shows a cross-sectional view of the arrangement of FIG. 4B.

FIGS. 4A to 4C show yet another example of a shield 10. In this example, the contact fingers 13 have a curved profile rather than planar.

As in the examples of 2A to 2E, 3A to 3C and 4A to 4C, the shield or shields preferably have plural parallel lines of plural projections 13 to form an enhanced barrier minimising coupling between one line of projections 13 to another line of projections 13 or between projections 13 in a line. Alternatively, the adjacent lines of projections 13 may be offset or staggered to form an enhanced barrier.

In the examples of FIGS. 2A to 2E, 3A to 3C and 4A to 4C, the shields have projections 13 that can be thought of as in effect integral leaf springs.

Figure 5A:
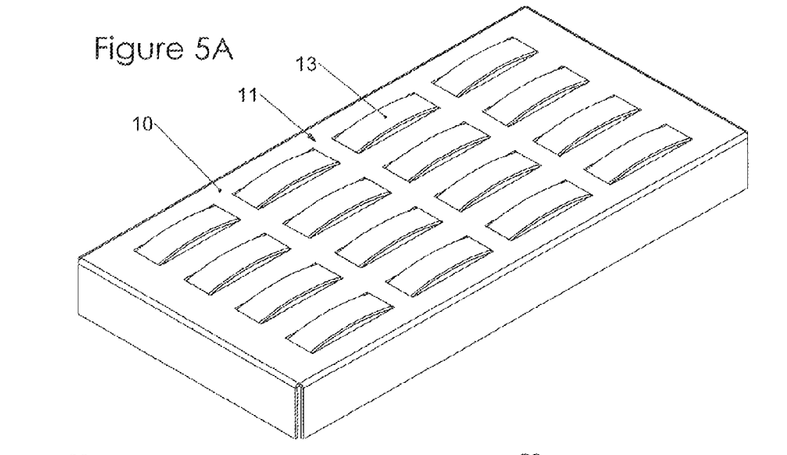
FIG. 5A shows a perspective view of another example of an electromagnetic shield according to an embodiment of the present invention.
Figure 5B:
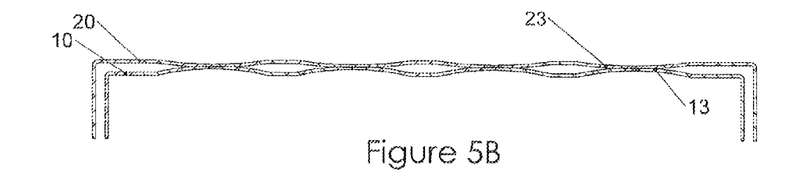
FIG. 5B shows in cross-section the shield of FIG. 5A in combination with a second shield.
Figure 5C:
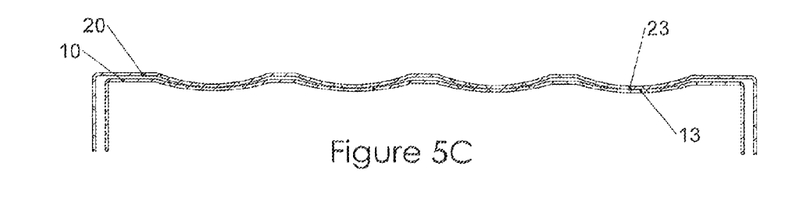
FIG. 5C shows in cross-section the shield of FIG. 5A in combination with another second shield.

FIG. 5A and 5B show another example of an electromagnetic shield 10. In this example, the top surface 11 of the shield 10 has projections 13 in the form of raised protrusions 13, or bumps, or some other upwardly projecting surface shaping. As shown by FIG. 5B, the second shield 20 has corresponding downwardly projecting protrusions 23, or dents, or some other downwardly projecting surface shaping, which are aligned with the protrusions 13 on the first shield 10, so that electrical connection is formed between the two shields 10, 20 as they are placed on the circuit board 1. FIG. 5C shows an alternative arrangement where the second shield 20 has upwardly projecting protrusions 23, which are aligned with the protrusions 13 on the first shield 10, so that the protrusions 13, 23 mate and electrical connection is formed between the two shields 10, 20 as they are placed on the circuit board 1. This allows a tighter space between the first and second shields 10, 20, which may be beneficial where space on the circuit board 1 is limited.

In the examples of FIGS. 5A to 5C, the shields 10, 20 are again preferably made from sheet metal. The sheet metal provides a certain degree of resiliency so that the protrusions 13, 23 are resiliently biased against each other when the two shields 10, 20 are positioned on the circuit board 1, so as to form a good electrical continuity between the two shields 10, 20.

Figure 6A:
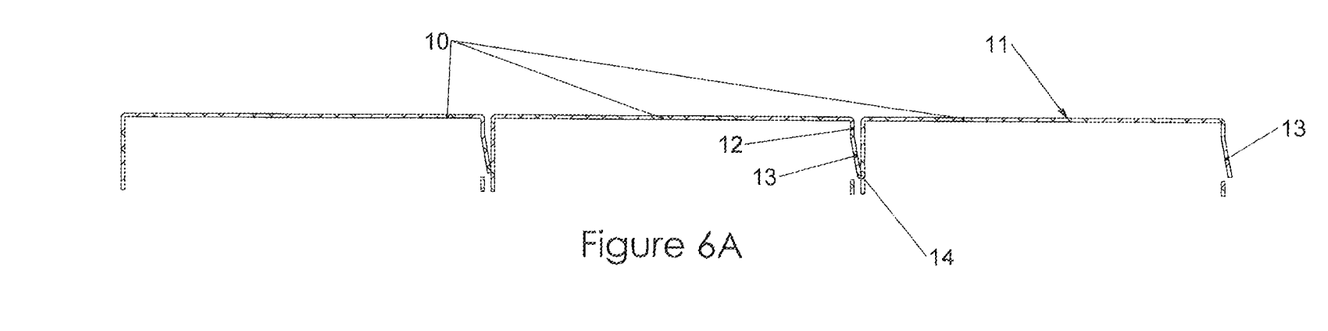
FIGS. 6A and 6B show cross-sectional views of another example of an electromagnetic shield according to an embodiment of the present invention.

Referring to FIG. 6A, a further example of an arrangement of electromagnetic shields 10 is shown. In this example, the shields 10 have projections in the form of resiliently biased contact fingers 13 on their side portions 12. Thus, when any two shields 10 are placed side by side on the board, a good electrical connection is formed between the shields 10, which helps improve the grounding of the shields 10 and helps suppress undesired propagation modes.

Figure 6B:
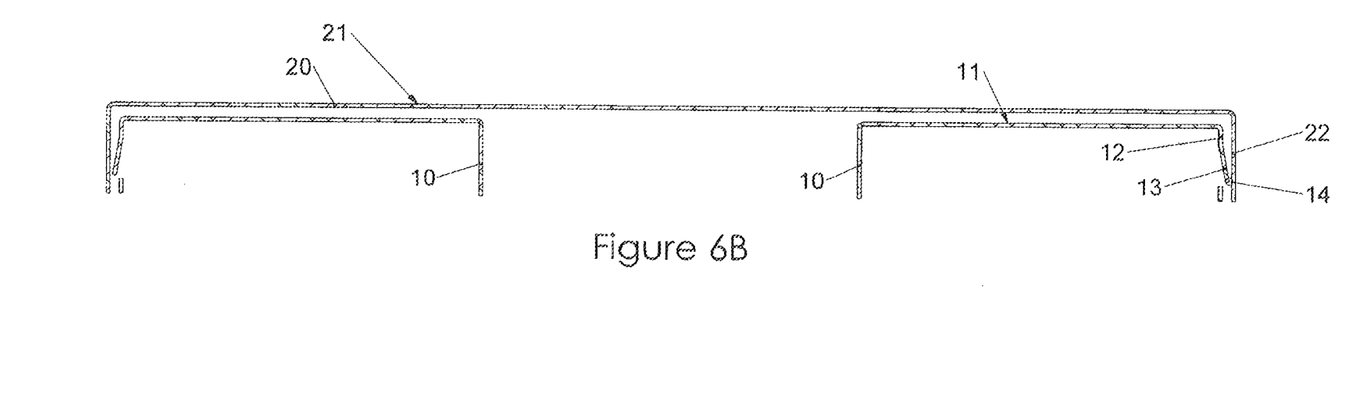

As shown in FIG. 6B, the first shields 10 may have projections 13 on their side portions 12, which are used to make electrical contact with the side portions 22 of a second shield 20. Alternatively or additionally, the second shield 20 may have projections 13 on its side portions 22 for contacting the side portions 12 of the first shields 10.

The shields disclosed herein are capable of being arranged in many ways to provide flexible and convenient shielding to electrical circuits.

Figure 7:
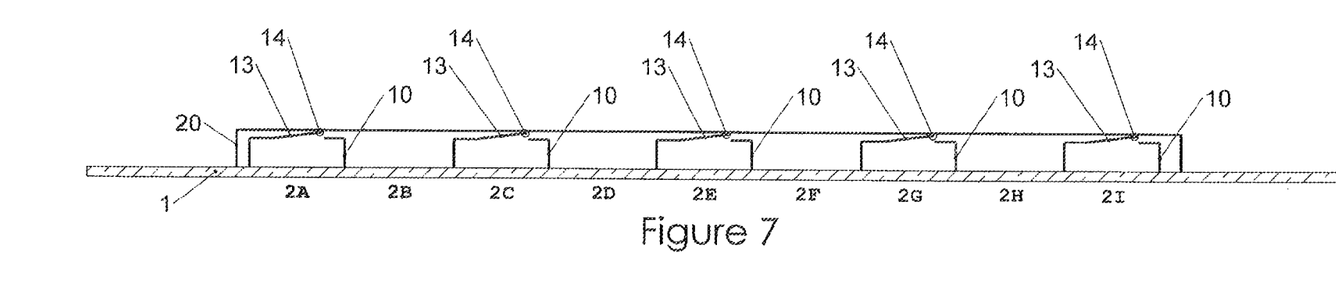
FIG. 7 shows an example of a shielding arrangement for a circuit board in accordance with an embodiment of the present invention.

For example, FIG. 7 shows in cross section the shielding arrangement of FIG. 1. As previously described, this arrangement allows six shields (five lower shields 10 and an upper shield 20) to be used to create nine compartments on the circuit board 1 (compared with using nine shields to provide an individual, shield over each of areas 2A to 2I as is conventional). This is advantageous in that fewer shields are needed to form compartments over the seven areas of the circuit board (2A to 2I). This helps keep the component count low, saving cost in components and cost in assembling and maintaining the circuit. This also saves space on the circuit board 1 used for connector clips 3, due to the fact that the side walls of the first shields 10 have the dual function of providing side walls of two shields for adjacent areas of the board. The removable nature of the shields 10, 20 allows easy access to the components within the compartments on the circuit board 1, for example if It is desired to test or configure the circuitry.

Figure 8:
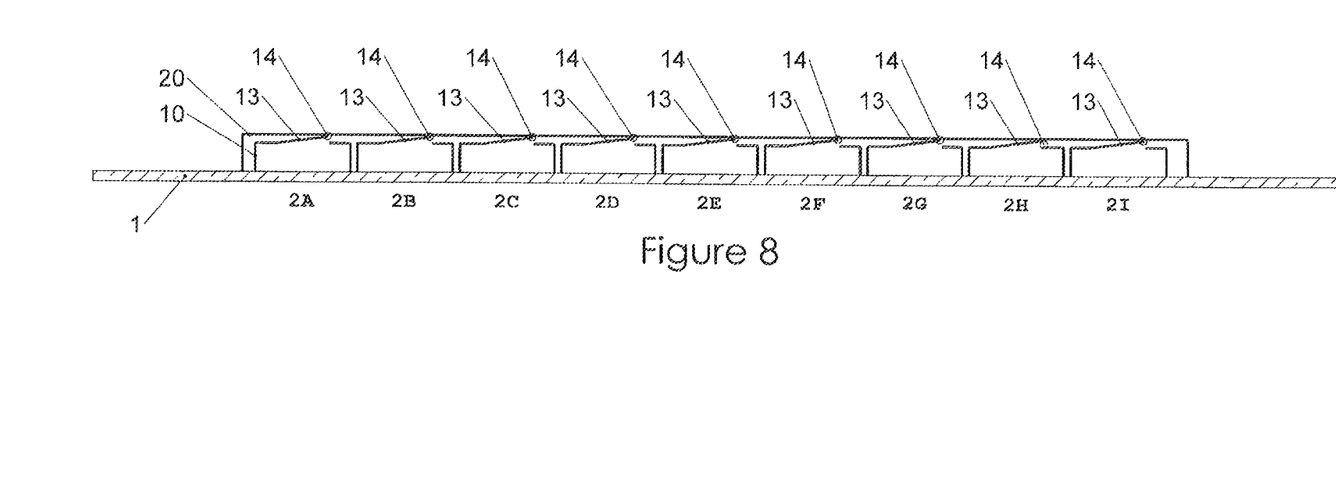
FIG. 8 shows in cross-section another example of a shielding arrangement for a circuit board in accordance with an embodiment of the present invention.

Another arrangement is shown by way of example by FIG. 8, which shows a cross sectional view of the circuit of FIG. 1 with a different shielding arrangement. In the arrangement of FIG. 1, each of the areas 2A to 2I is provided with an electromagnetic shield 10 of the sort shown in FIG. 6, with electrical connection being made between each adjacent shield 10 by its side contact fingers 13. Optionally, the shields 10 have projections 13 formed in their upper surface 11 (for example as shown in FIGS. 2 to 5), and a larger shield 20 provided over the top of ail of the lower shields 10. This for example can form an added layer of protection to contain any radiation that might leak from the first shield 10.

In the examples of FIG. 7 and FIG. 8, the connection between the first shields 10 and the second shield 20 can be alternatively or additionally formed by side projections 13 formed on the first and/or second shields as described above in relation to FIGS. 6A and 6B.

Figure 9:
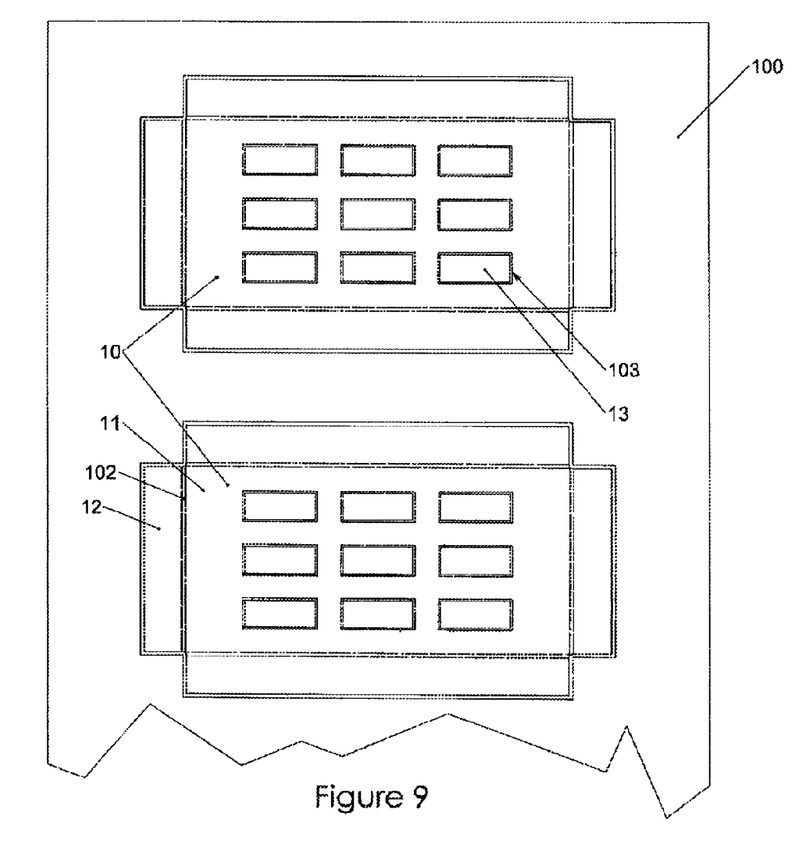
FIG. 9 shows a piece of sheet metal prepared for forming an electromagnetic shield in accordance with an embodiment of the present invention.

The preferred electromagnetic shields 10, 20 are also simple to manufacture using established techniques. For example, FIG. 9 shows a sheet of metal 100 that has been prepared for forming an electromagnetic shield 10 shown for example by FIG. 2A. As can be seen, the periphery 101 of the shield 10 has been cut out. Also, the periphery 103 of the contact fingers 13 has been cut out. In addition, the edges 102 between the top portion 11 and side portions 12 of the shield 10 have been partially removed. Once the shield 10 has been removed from the sheet 100, the cut out portions can be pressed into shape, i.e. the edge portions 12 can be folded down, aided by the partially moved material along the edges 102. Similarly, the contact fingers 13 can be shaped or pressed so as to protrude from the surface of the shield 10.

The cut outs and partial removal of material can be accomplished by laser or chemical etching, stamping, or indeed any suitable means for removing or shaping material, as known in the art per se.

Similar techniques can be used to form other preferred embodiments of the shield 10 from sheet, metal 100 by appropriate etching and/or pressing of the sheet material.

This can allow multiple shields 10 to be formed from a sheet of material, before being assembled. This provides a low cost and convenient way for manufacturing the shields, using existing techniques.

Many other arrangements of the shields are possible within the scope of the present invention as defined by the claims. For example electromagnetic shields can be nested three deep, with contact fingers being provided on either or both of adjacent shields to make contact with its neighbour. Many different forms of projection 13 can be used to provide contact points between adjacent shields. Contact fingers 13 may be soldered, welded or otherwise attached to the shields 10, 20, instead of being integrally formed from the material of the shield 10, 20.

Embodiments of the present invention have been described with particular reference to the examples illustrated. However, it will be appreciated that variations and modifications may be made to the examples described within the scope of the present invention.

The invention claimed is:

1. A method of shielding a circuit board, the method comprising:
    placing at least two lower electromagnetic shields over different areas of a surface of a circuit board, the at least two lower shields each comprising an upper wall and side walls that extend continuously around all of a periphery of the upper wall, the at least two lower shields defining with the circuit board respective shielded cavities on the circuit board; and
    placing an upper electromagnetic shield over an area of the surface of the circuit board, the upper shield having an upper wall and side walls that extend continuously around all of the periphery of the upper wall to form a fully shielded cavity, the upper shield enclosing the at least two lower shields, wherein each of the two lower shields extends from one side wall of the upper shield to an opposite side wall of the upper shield such that at least one additional shielded cavity is formed on the circuit board over the area between the at least two lower shields by walls of the at least two lower shields and the walls of the upper shield so as to fully enclose the additional cavity,
    wherein at least one of the electromagnetic shields has at least one projection therefrom that contacts and makes electrical connection with a surface of another electromagnetic shield when the shields are placed on the circuit board, wherein the upper and lower shields are removably clipped to the surface of the circuit board.

2. The method according to claim 1, wherein at least one lower shield has at least one of the projections on its upper wall so as to contact and make electrical connection with the upper wall of the upper electromagnetic shield, 3. The method according to claim 1, wherein the upper shield has at least one of the projections on projecting downwards from its upper wall so as to contact and make electrical connection with the upper wall of at least one of the two lower electromagnetic shields.

4. The method according to claim 1, wherein the side wall of at least one shield has at least one of the projections so as to contact and make electrical connection with the side wall of another electromagnetic shield.

5. The method according to claim 1, wherein at least one of the projections is resiliently biased from the body portion of the shield from which it projects.

6. The method according to claim 1, wherein at least one projection is provided by a biased finger projecting from the body of the shield from which it projects.

7. The method according to claim 6, wherein the finger is formed by a cutout portion of the shield from which it projects.

8. The method according to claim 7, wherein an electromagnetic radiation absorbent material layer and/or an electromagnetic reflective material layer is disposed on the body of the shield from which the projection projects on the opposite side to the projection.

9. The method according to claim 1, wherein at least one projection is formed by a stamped shaping on the surface of the body of the shield.

10. The method according to claim 1, wherein at least one projection on at least one shield is formed by shaping on the surface of the body of the shield, and at least one other shield has corresponding shaping extending either towards or away from the other shaping.

11. The method according to claim 1, comprising providing a plurality of projections to create a plurality of contact points between the upper and lower shields.

12. The method according to claim 11, where adjacent contact points are separated by a distance 'd', where d is less than 25% of the wavelength of the radiation being shielded.

13. The method according to claim 1, wherein at least one lower shield is made from a first material and the upper shield is made from a second material different from the first material, the first material being stronger than the second material and the second material being more flexible than the first material.

14. The method according to claim 1, wherein at least one shield has plural parallel lines each having plural projections.

15. The method according to claim 14, wherein the projections of at least one line are offset from the projections of an adjacent line.

16. The method according to claim 1, wherein at least one electromagnetic shield is manufactured by:
    bending a conductive sheet member to form the upper walls and side walls and to form a plurality of the projections therein for contacting and making electrical connection, in use, with another, adjacently positioned electromagnetic shield.

17. The method according to claim 16, wherein the at least one electromagnetic shield is manufactured by:
    cutting a plurality of fingers in a sheet metal member;
    bending said fingers to project away from said sheet metal member, said fingers providing said projections.

18. The method according to claim 16, wherein cutting is performed by one or more of: laser etching; chemical etching; and stamping.

19. A circuit comprising:
    a circuit board;
    at least two lower electromagnetic shields placed over different areas of the surface of the circuit board, the at least two lower shields each comprising an upper wall and side walls that extend continuously around all of a periphery of the upper wall, the at least two lower shields defining with the circuit boards respective shielded cavities on the circuit board: and an upper electromagnetic shield placed over an area of the surface of the circuit board, the upper shield having an upper wall and side walls that extend continuously around all of the periphery of the upper wall to form a fully shielded cavity. the upper shield enclosing the at least two lower shields, wherein each of the two lower shields extends from one side wall of the upper shield to an opposite side wall of the upper shield such that at least one additional shielded cavity is formed on the circuit board over the area between the at least two lower shields by walls of the at least two lower shields and the wall of the upper shield so as to fully enclose the additional cavity, wherein at least one of the electromagnetic shields has at least one projection therefrom that contacts and makes electrical connection with a surface of another electromagnetic shield when the shields are placed on the circuit board, wherein the upper and lower shields are removably clipped to the surface of the circuit board.

* * * * *